US006310684B1

(12) United States Patent
Matsuura

(10) Patent No.: US 6,310,684 B1
(45) Date of Patent: Oct. 30, 2001

(54) METHOD OF MEASURING SPHERICAL ABERRATION IN PROJECTION SYSTEM

(75) Inventor: Seiji Matsuura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/552,306

(22) Filed: Apr. 19, 2000

(30) Foreign Application Priority Data

Apr. 19, 1999 (JP) .................................................. 11-110982

(51) Int. Cl.$^7$ ...................................................... G01B 9/00
(52) U.S. Cl. .................................................. 356/124; 430/5
(58) Field of Search ..................................... 356/121, 124, 356/125, 126, 127, 399–401; 355/53, 55; 250/548; 430/5

(56) References Cited

U.S. PATENT DOCUMENTS 5,424,552 * 6/1995 Tsuji et al. ............................ 356/401
5,935,738 * 8/1999 Yasuzato et al. ........................ 430/5

FOREIGN PATENT DOCUMENTS

| 2712529 | 10/1997 | (JP) . |
| 10-148926 | 6/1998 | (JP) . |
| 10-176974 | 6/1998 | (JP) . |
| 10-232185 | 9/1998 | (JP) . |

* cited by examiner

*Primary Examiner*—Hoa Q. Pham
(74) *Attorney, Agent, or Firm*—Sughrue, Mion, Zinn, Macpeak & Seas, PLLC

(57) ABSTRACT

There is provided a method of measuring spherical aberration in a projection system in which a mask pattern is projected in a reduced scale with a light having a wavelength of $\lambda$, including the steps of (a) projecting a first mask pattern onto a photosensitive object in a reduced scale, the first mask pattern being defined by light-permeable portions and light-impermeable portions each sandwiched between the light-permeable portions, each of the light-permeable portions having a width equal to the wavelength $\lambda$, (b) projecting a second mask pattern onto the photosensitive object in a reduced scale, the second mask pattern being defined by light-permeable portions and light-impermeable portions each sandwiched between the light-permeable portions. each of the light-permeable portions having a width equal to $\lambda/2$, (c) exposing the photosensitive object to the light having a wavelength of $\lambda$, and developing the photosensitive object, (d) measuring a first location of the photosensitive object at which a width of the light-impermeable portions of the first mask pattern is focused in a minimum, and a second location of the photosensitive object at which a width of the light-impermeable portions of the second mask pattern is focused in a minimum, and (e) measuring spherical aberration, based on the first and second locations. The method makes it possible to accurately measure spherical aberration in a projection system through the use of Levenson type mask patterns having different sizes.

7 Claims, 6 Drawing Sheets

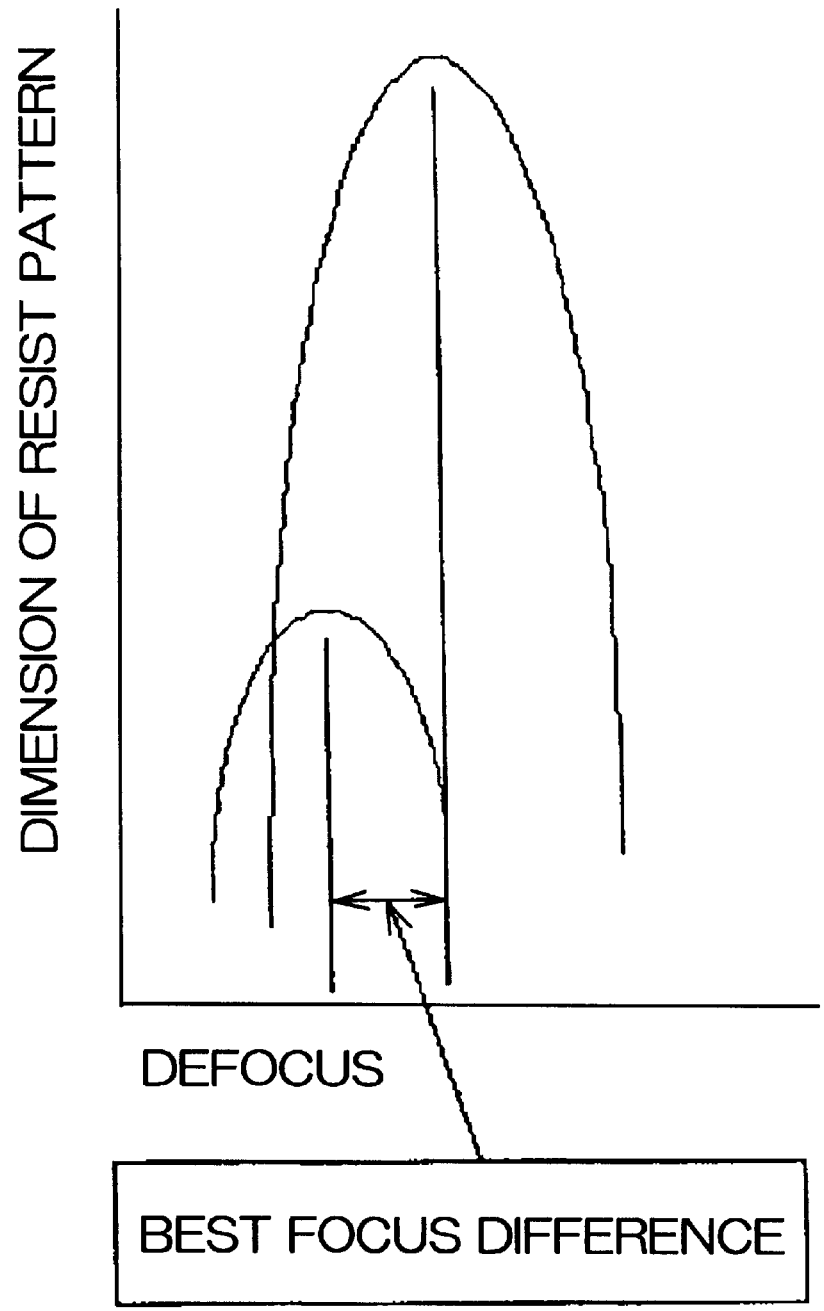

METHOD OF MEASURING SPHERICAL ABERRATION IN PROJECTION SYSTEM

BACKGROUND OF THE INVENTION

1. Field of the Invention

The invention relates to a method of accurately measuring spherical aberration in a projection optical system in a reduction projection step and repeat exposure system (stepper) through the use of Levenson type mask patterns having different sizes.

2. Description of the Related Art

One of conventional methods of adjusting spherical aberration in a projection system is disclosed in Japanese Unexamined Patent Publication No. 2-278811. This method makes it possible to compensate for vertical spherical aberration in a projection system. In the method, vertical spherical aberration $\Delta 10$ corresponding to 100% of an aperture in the projection system is designed to be equal to or smaller than $2.5 \times \lambda/NA^2$, and is further designed to be greater than $-0.5 \times \Delta 70$, but smaller than $1.5 \times \Delta 70$, wherein $\Delta 70$ indicates spherical aberration corresponding to 70% of the aperture.

Since an optical image focused by the projection system is observed as a resist image resulted from multi-reflection occurring in the resist having a certain thickness, an optical image focused in an optical system having no aberration cannot always present the best resist image. Hence, the suggested method makes it possible to deepen a focus of depth without reduction in resolution, by adjusting vertical spherical aberration in a projection system into a certain range.

Japanese Unexamined Patent Publication No. 10-148926 has suggested a method of projecting a half-tone phase shift mask pattern in a reduced scale to thereby focus both a focal point on an optical axis in a projection system and a focal point not on an optical axis on a plane of a photosensitive plate. The half-tone phase shift mask has a transparent portion and a semi-transparent portion. The transparent portion has a thickness varying dependent on a height of an image from an optical axis.

In the method, there is prepared a half-tone phase shift mask having a certain degree of shift. A photosensitive late is exposed to light and developed through the use of the mask. Then, a relation between an image's height and a focal point is measured based on the result of development, and spherical aberration is measured based on the thus measured relation. Then, there is estimated a degree of phase shift, that is, a thickness of the transparent portion which would focus the focal point on a plane of the photosensitive plate. In the suggested method, a degree of phase shift and a focal point are plotted in a graph, using spherical aberration as a parameter, to thereby accomplish an optimal halftone phase shift mask.

Japanese Unexamined Patent Publication No. 10-176974 has suggested a method of measuring aberration in a projection system, comprising the steps of positioning a mask on an optical path, the mask including either a line and space pattern or an isolating line pattern, positioning a substrate on which a resist is coated, on a location at which a light is projected by the projection system, projecting the pattern onto the resist by means of the projection system to thereby expose the resist to light, developing the resist, and measuring a positional divergence of an image of either the line and space pattern or the isolating line pattern, the positional divergence being caused due to the resist formed on the substrate.

Japanese Unexamined Patent Publication No. 10-232185 has suggested a method of measuring aberration in a projection system, comprising the steps of positioning a mask on an optical path in the projection system, the mask including a line and space pattern having lines of the same width, positioning a substrate on which a resist is coated, on a location at which a light is projected by the projection system, projecting the line and space pattern onto the resist by means of the projection system to thereby expose the resist to light, developing the resist, and measuring aberration, based on a difference in a line width between the opposite patterns in a pitch direction of an image of the line and space pattern, the difference being caused due to the resist formed on the substrate.

A mask used for fabrication of LSI is generally designed to include patterns having different line widths and different space widths. That is, a mask generally includes both a line and space having a relatively wide line width and a relatively great space width, as illustrated in FIG. 1A, and a line and space having a relatively narrow line width and a relatively small space width, as illustrated in FIG. 1B.

FIG. 2 is a graph illustrating a best focal point of each of the line and space illustrated in FIG. 1A and the line and space illustrated in FIG. 1B. A difference between those best focal points (hereinafter, referred to as "best focus difference") is caused due to spherical aberration in a projection system. Hence, it is usually done to narrow spherical aberration of a projection lens, using the best focus difference as a parameter.

For instance, in a projection system in which KrF excimer laser is used as a light source, spherical aberration is attempted to be made smaller, based on the best focus difference between a line and space having a line width and a space width which are almost equal to a wavelength of KrF excimer laser, 0.24 micrometers, and a line and space having a line width and a space width which are greater than a wavelength of KrF excimer laser, for instance 0.40 micrometers.

However, it is quite difficult to accurately measure a best focal point, and hence, it would be unavoidable to measure a best focal point with an error. The reason why an error is unavoidable is that abrasion of a line and space pattern has to be taken into consideration as well as a dimension of the pattern in order to accurately measure a best focal point of the pattern, but such abrasion is quite difficult to measure. An error of a best focal point, caused by such abrasion, is about 0.1 micrometer.

In addition, a best focal point associated with spherical aberration is not sufficiently great. Specifically, an exposure system being adjusted would have spherical aberration of about $0.1\lambda$, wherein $\lambda$ indicates a wavelength of a light, whereas a best focus difference is equal to about 0.15 micrometers when an ordinary mask is used.

FIG. 3A illustrates a positional relation between a pupil plane 50 and diffracted lights in a line and space having a relatively wide line width and a relatively great space width, and FIG. 3B illustrates the same in a line and space having a relatively narrow line width and a relatively small space width. Spherical aberration is caused by a difference in an optical path which difference is generated in dependence on a distance between a diffracted light and a center of a pupil plane. Since first-order diffracted lights are spaced away from a center of a pupil plane by different distances, an image-forming characteristic of a pattern formed by first-order diffracted lights provides data about spherical aberration.

As illustrated in FIG. 3A, a zero-order deffracted light 40, first-order diffracted lights 41 and second-order diffracted lights 42 are within a pupil plane 50 in a line and space having a relatively wide line width and a relatively great space width, and as illustrated in FIG. 3B, a zero-order diffracted light 60 and first-order diffracted lights 61 are within a pupil plane 70 in a line and space having a relatively narrow line width and a relatively small space width.

Those zero-order diffracted lights 40 and 60, the second-order diffracted lights 42, and other higher-order diffracted lights cancel data about the first-order diffracted lights 41 and 61. As a result, it is considered that the best focus difference becomes small.

SUMMARY OF THE INVENTION

In view of the above-mentioned problem in the conventional methods, it is an object of the present invention to provide a method of measuring spherical aberration in a projection system which method makes it possible to accurately measure a difference between best focal points of a line and space having a relatively wide line width and a relatively great space width and a line and space having a relatively narrow line width and a relatively small space width.

There is provided a method of measuring spherical aberration in a projection system in which a mask pattern is projected in a reduced scale with a light having a wavelength of $\lambda$, including the steps of (a) projecting a first mask pattern onto a photosensitive object in a reduced scale, the first mask pattern being defined by light-permeable portions and light-impermeable portions each sandwiched between the light-permeable portions, each of the light-permeable portions having a width equal to the wavelength $\lambda$, (b) projecting a second mask pattern onto the photosensitive object in a reduced scale, the second mask pattern being defined by light-permeable portions and light-impermeable portions each sandwiched between the light-permeable portions, each of the light-permeable portions having a width equal to $\lambda/2$, (c) exposing the photosensitive object to the light having a wavelength of $\lambda$, and developing the photosensitive object, (d) measuring a first location of the photosensitive object at which a width of the light-impermeable portions of the first mask pattern is focused in a minimum, and a second location of the photosensitive object at which a width of the light-impermeable portions of the second mask pattern is focused in a minimum, and (e) measuring spherical aberration, based on the first and second locations.

It is preferable that the light-permeable portions are defined by first light-permeable portions and second light-permeable portions, the first and second light-permeable portions being alternately sandwiched between the light-impermeable portions, and that a light having passed through the first light-permeable portions has a phase different by 180 degrees from a phase of a light having passed through the second light-permeable portions.

The steps (a) and (b) may be carried out concurrently or in sequence.

It is preferable that the method further includes the step of varying directions in which the first and second mask patterns extend to thereby measure spherical aberration entirely in a pupil.

There is further provided a method of measuring spherical aberration in a projection system in which a mask pattern is projected in a reduced scale with a light having a wavelength of $\lambda$, including the steps of (a) projecting first to N-th mask patterns onto a photosensitive object in a reduced scale, the first to N-th mask patterns being defined by first to N-th light-permeable portions and first to N-th light-impermeable portions each sandwiched between the first to N-th light-permeable portions, respectively, each of the first to N-th light-permeable portions having a width equal to $M\lambda/N$, wherein N is an integer equal to or greater than 3 and M is an integer ranging from 1 to N, (b) exposing the photosensitive object to the light having a wavelength of $\lambda$, and developing the photosensitive object, (c) measuring first to N-th locations of the photosensitive object at which a width of each of the first to N-th light-impermeable portions is focused in a minimum, and (d) measuring spherical aberration, based on the first to N-th locations.

It is preferable that each of the first to N-th light-permeable portions is defined by first light-permeable sections and second light-permeable sections, the first and second light-permeable sections being alternately sandwiched between the first to N-th light-impermeable portions, and that a light having passed through the first light-permeable sections has a phase different by 180 degrees from a phase of a light having passed through the second light-permeable sections in the first to N-th mask patterns.

It is preferable that the method further includes the step of varying directions in which the first to N-th mask patterns extend to thereby measure spherical aberration entirely in a pupil.

The advantages obtained by the aforementioned present invention will be described hereinbelow.

In accordance with the present invention, it is possible to accurately measure a difference in a best focal point between a line and space having a relatively wide line width and a relatively great space width and a line and space having a relatively narrow line width and a relatively small space width, ensuring accurate measurement of spherical aberration in a projection system.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 2 is a graph showing a relation between a dimension of a resist pattern and a best focal point of each of the line and space illustrated in FIG. 1A and the line and space illustrated in FIG. 1B.

DESCRIPTION OF THE PREFERRED EMBODIMENTS

Figure 4A:
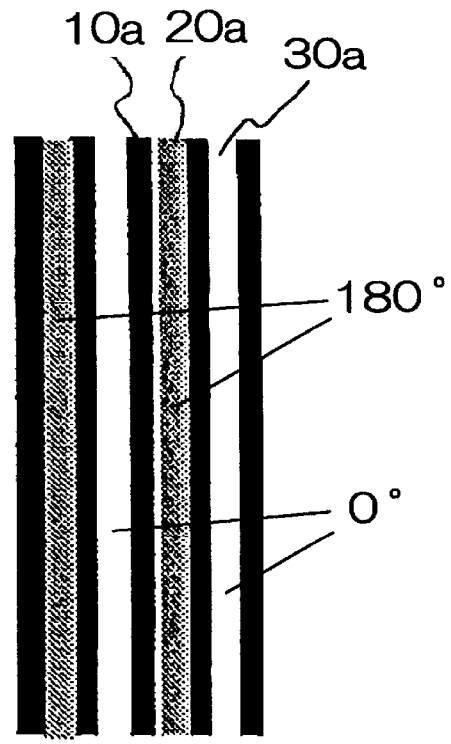
FIG. 4A illustrates in example of the Levenson type mask used in the present invention.

FIG. 4A illustrates a first line and space pattern including light-impermeable portions 10a which disallows a light to pass therethrough, and light-permeable portions 20a and 30a both of which allow a light to pass therethrough. The light-permeable portions 20a and 30a are alternately sandwiched between the light-impermeable portions 10a.

The light-impermeable portions 20a and 30a both have a Levenson type structure, and have alternately inverted phases, that is, the light-impermeable portion 20a has a phase different by 180 degrees from a phase of the light-impermeable portion 30a. For instance, as illustrated in FIG. 4A, the light-impermeable portions 20a have a phase of 180 degrees, whereas the light-impermeable portions 30a have a phase of 0 degrees. The light-impermeable portions 20a and 30a have a width equal to a wavelength $\lambda$ of a light used for exposure.

Figure 4B:
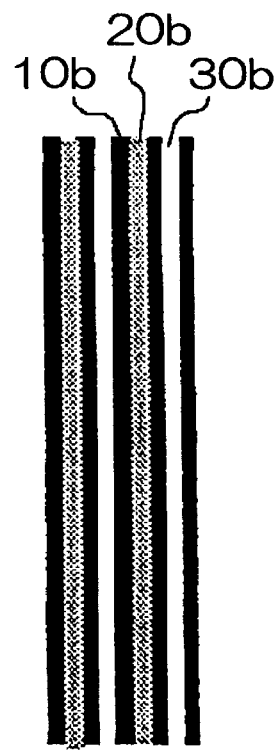
FIG. 4B illustrates another example of the Levenson type mask used in the present invention.

FIG. 4B illustrates a second line and space pattern including light-impermeable portions 10b which disallows a light to pass therethrough, and light-permeable portions 20b and 30b both of which allow a light to pass therethrough. The light-permeable portions 20b and 30b are alternately sandwiched between the light-impermeable portions 10b.

The light-impermeable portions 20b and 30b both have a Levenson type structure, and have alternately inverted phases, that is, the light-impermeable portion 20b has a phase different by 180 degrees from a phase of the light-impermeable portion 30b. For instance, the light-impermeable portions 20b have a phase of 180 degrees, whereas the light-impermeable portions 30b have a phase of 0 degree. The light-impermeable portions 20b and 30b have a width equal to a wavelength $\lambda/2$ of a light used for exposure.

Figure 5:
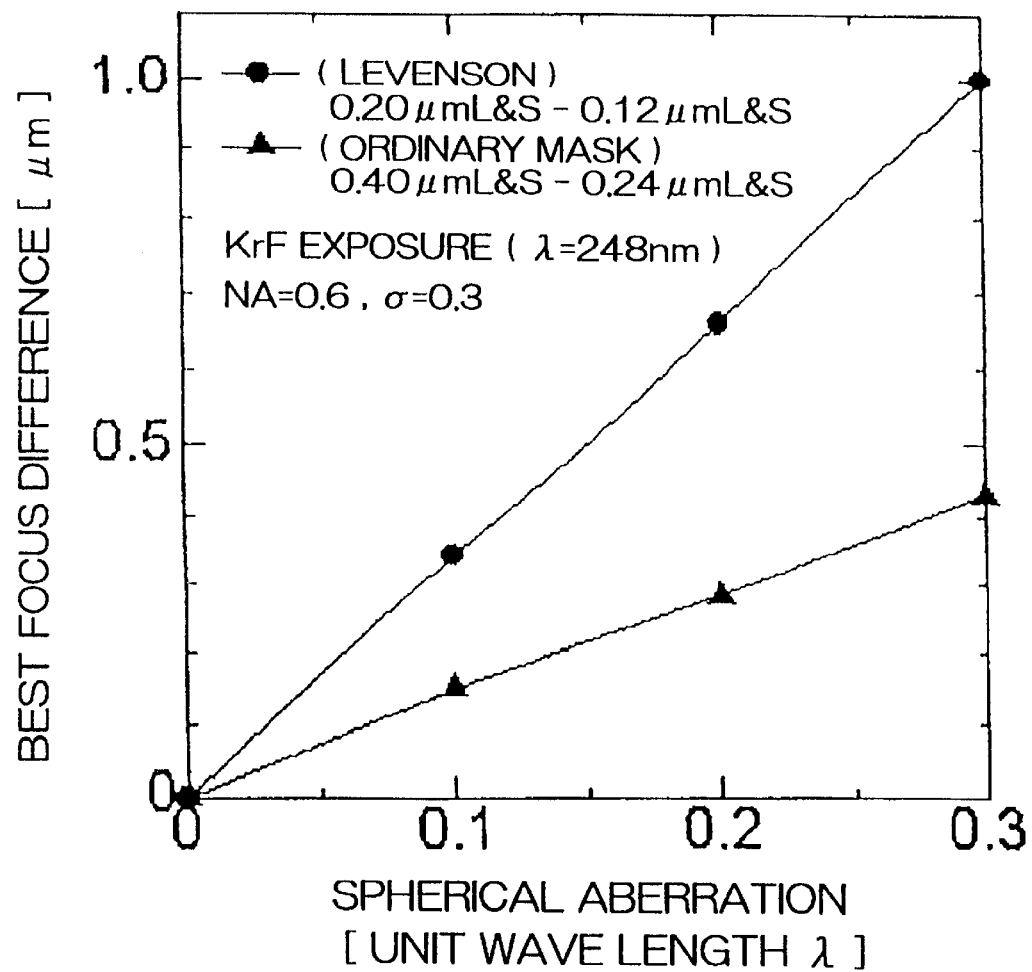
FIG. 5 is a graph showing a relation between a best focus difference and spherical aberration in patterns having different sizes.

FIG. 5 is a graph showing a relation between a best focus difference and a mask. In the graph illustrated in FIG. 5, there is used a light source which emits KrF excimer laser having a wavelength of 248 nm, a projection system has a numerical aperture (NA) of 0.6. In the graph, there are used a Levenson type mask and an ordinary mask. The Levenson type mask has a line and space pattern having light-permeable portions having a width of 0.20 micrometers and light-impermeable portions having a width of 0.12 micrometers. The ordinary mask has a line and space pattern having light-permeable portions having a width of 0.40 micrometers and light-impermeable portions having a width of 0.24 micrometers.

A difference between dimensions of the first and second line and space patterns and a best focus is measured as follows.

First, resist is coated onto a photosensitive plate. Then, the first and second line and space patterns illustrated in FIGS. 4A and 4B are projected onto the resist in a reduced scale, and the resist is exposed to a light. Then, the resist is developed.

Then, best focal points in the first and second line and space patterns are measured, based on the result of development of the resist.

For instance, the best focal points may be measured as locations of the photosensitive plate at which widths of the light-impermeable portions 10a and 10b in the first and second line and space patterns are focused in minimum on an optical axis in a projection system.

As illustrated in FIG. 5, the best focus difference, defined as a difference in a best focal point between the first and second line and space patterns, is two or three times greater in the Levenson mask than in the ordinary mask. The best focus difference is caused by spherical aberration. By measuring the best focus difference, based on the resist images, the spherical aberration in a projection system can be measured more accurately than the conventional methods.

Figure 6A:
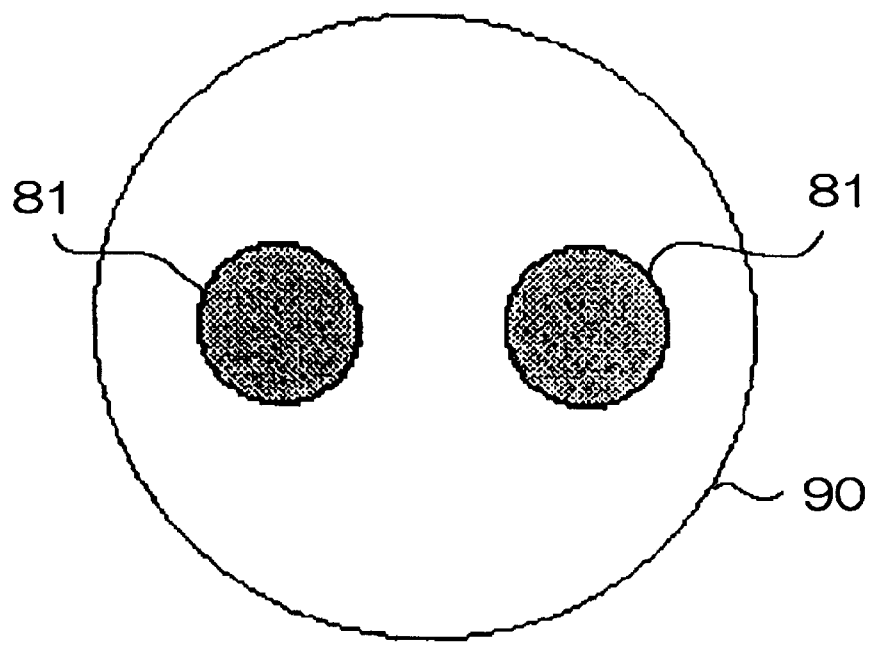
FIG. 6A illustrates a relation between a pupil in a projection system and lights diffracted from a mask pattern having a line and space having a relatively narrow line width and a relatively small space width, in the present invention.
Figure 6B:
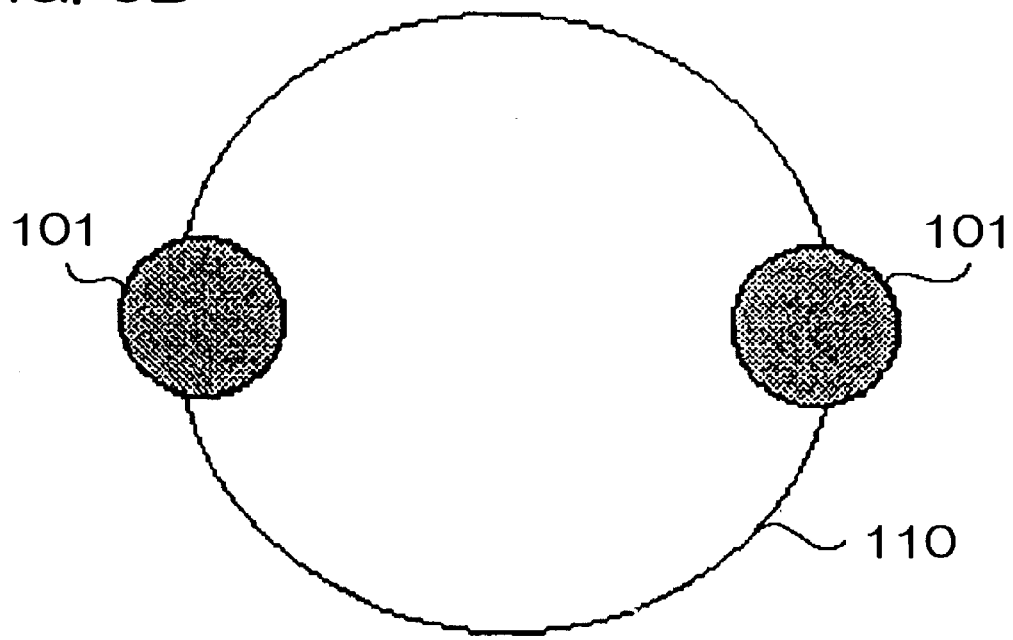
FIG. 6B illustrates a relation between a pupil in a projection system and lights diffracted from a mask pattern having a line and space having a quite narrow line width and a quite small space width, in the present invention.

FIGS. 6A shows a positional relation between a pupil 90 of a projection lens and diffracted lights 81 passing through the first line and space pattern illustrated in FIG. 4A, and FIGS. 6B shows a positional relation between a pupil 110 of a projection lens and diffracted lights 101 passing through the second line and space pattern illustrated in FIG. 4B.

Figure 1A:
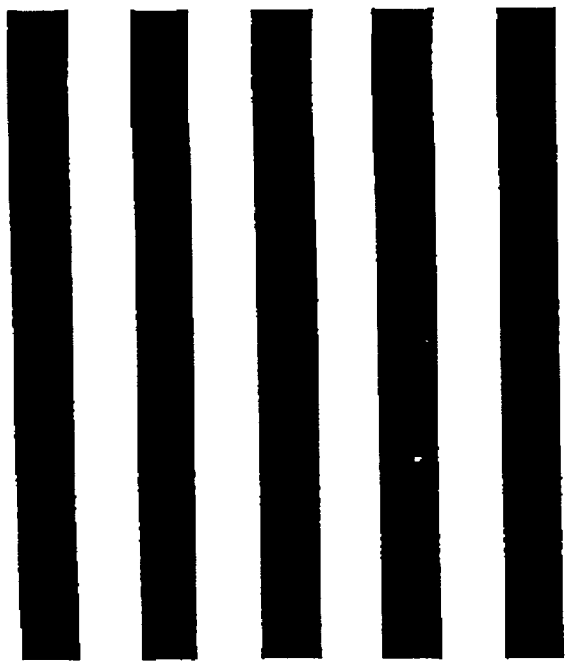
FIG. 1A illustrates a mask pattern having a line and space having a relatively wide line width and a relatively great space width.
Figure 1B:
FIG. 1B illustrates a mask pattern having a line and space having a relatively narrow line width and a relatively small space width.
Figure 3A:
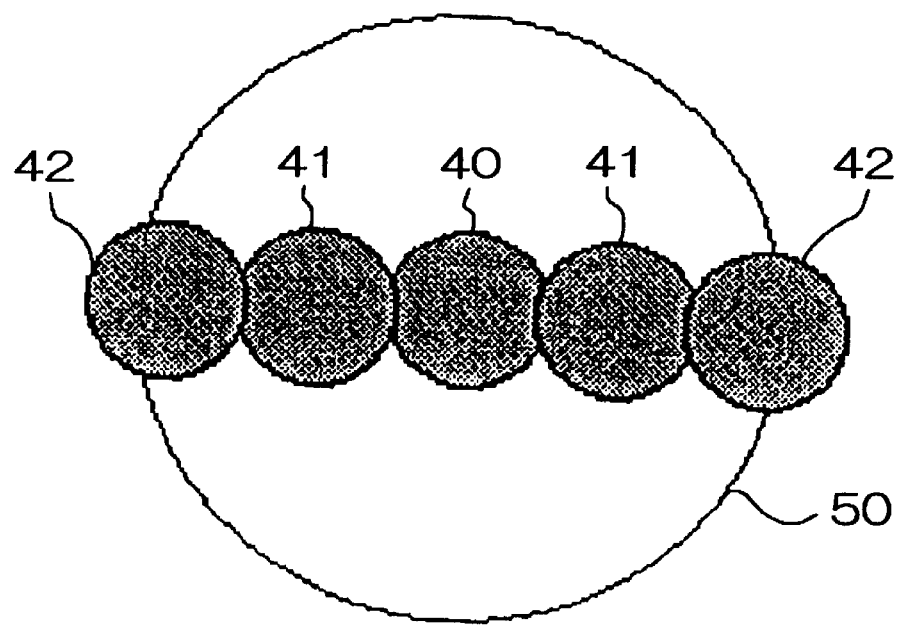
FIG. 3A illustrates a relation between a pupil in a projection system and lights diffracted from a mask pattern having a line and space having a relatively wide line width and a relatively great space width.
Figure 3B:
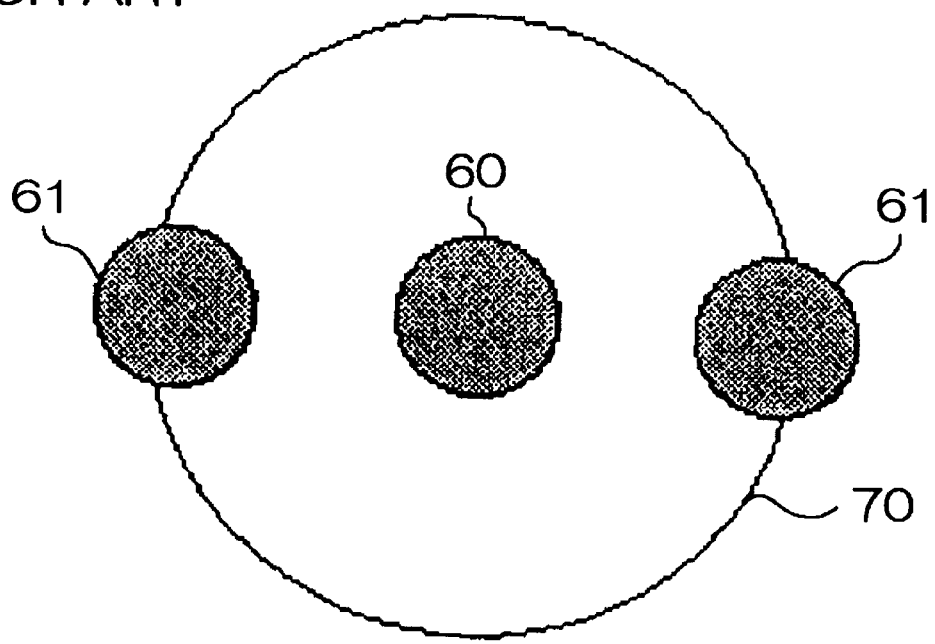
FIG. 3B illustrates a relation between a pupil in a projection system and lights diffracted from a mask pattern having a line and space having a relatively narrow line width and a relatively small space width.

As is understood in FIGS. 6A and 6B, the first-order lights 81 pass at the same location as the location at which the first-order lights 41 pass in FIG. 3A, and the first-order lights 101 pass at the same location as the location at which the first-order lights 61 pass in FIG. 3B. However, no diffracted lights pass at the location at which the zero-order lights 40, 60 and the second-order lights 42 pass in FIGS. 3A and 3B.

Accordingly, in the present embodiment, diffraction in the first and second line and space patterns is different from each other only in a distance between a center of the pupils 90, 110 and the diffracted lights 81, 101, which indicates that the diffraction is much influenced by spherical aberration.

Though the best focus difference between the two line and space patterns has been measured in the above-mentioned embodiment, it should be noted that the embodiment can be applied to measurement of a best focus difference among three or more line and space patterns.

For instance, when a best focus difference is to be measured among three line and space patterns, a first line and space pattern is designed to have light-permeable portions having a width equal to a wavelength $\lambda$ of a light, a second line and space pattern is designed to have light-impermeable portions each having a width equal to a wavelength $\lambda/3$ of a light, and a third line and space pattern is designed to have light-impermeable portions each having a width equal to a wavelength $2\lambda/3$ of a light.

By varying a direction in which a line and space pattern extends, it would be possible to measure spherical aberration entirely in a pupil of a projection lens.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-110982 filed on Apr. 19, 1999 including specification, claims, drawings and summary is incorporated herein by reference in its entirety.

What is claimed is:

1. A method of measuring spherical aberration in a projection system in which a mask pattern is projected in a reduced scale with a light having a wavelength of $\lambda$, comprising the steps of:

(a) projecting a first mask pattern onto a photosensitive object in a reduced scale, said first mask pattern being defined by light-permeable portions and light-impermeable portions each sandwiched between said light-permeable portions, each of said light-permeable portions having a width equal to said wavelength $\lambda$;

(b) projecting a second mask pattern onto said photosensitive object in a reduced scale, said second mask pattern being defined by light-permeable portions and light-impermeable portions each sandwiched between said light-permeable portions, each of said light-permeable portions having a width equal to $\lambda/2$;

(c) exposing said photosensitive object to said light having a wavelength of $\lambda$, and developing said photosensitive object;

(d) measuring a first location of said photosensitive object at which a width of said light-impermeable portions of said first mask pattern is focused in a minimum, and a second location of said photosensitive object at which a width of said light-impermeable portions of said second mask pattern is focused in a minimum; and (e) measuring spherical aberration, based on said first and second locations.

2. The method as set forth in claim 1, wherein said light-permeable portions are defined by first light-permeable portions and second light-permeable portions, said first and second light-permeable portions being alternately sandwiched between said light-impermeable portions, and wherein a light having passed through said first light-permeable portions has a phase different by 180 degrees from a phase of a light having passed through said second light-permeable portions.

3. The method as set forth in claim 1, wherein said steps (a) and (b) are concurrently carried out.

4. The method as set forth in claim 1, further comprising the step of varying directions in which said first and second mask patterns extend to thereby measure spherical aberration entirely in a pupil.

5. A method of measuring spherical aberration in a projection system in which a mask pattern is projected in a reduced scale with a light having a wavelength of $\lambda$, comprising the steps of:

(a) projecting first to N-th mask patterns onto a photosensitive object in a reduced scale, said first to N-th mask patterns being defined by first to N-th light-permeable portions and first to N-th light-impermeable portions each sandwiched between said first to N-th light-permeable portions, respectively, each of said first to N-th light-permeable portions having a width equal to $M\lambda/N$, wherein N is an integer equal to or greater than 3 and M is an integer ranging from 1 to N;

(b) exposing said photosensitive object to said light having a wavelength of $\lambda$, and developing said photosensitive object;

(c) measuring first to N-th locations of said photosensitive object at which a width of each of said first to N-th light-impermeable portions is focused in a minimum; and (d) measuring spherical aberration, based on said first to N-th locations.

6. The method as set forth in claim 5, wherein each of said first to N-th light-permeable portions is defined by first light-permeable sections and second light-permeable sections, said first and second light-permeable sections being alternately sandwiched between said first to N-th light-impermeable portions, and wherein a light having passed through said first light-permeable sections has a phase different by 180 degrees from a phase of a light having passed through said second light-permeable sections in said first to N-th mask patterns.

7. The method as set forth in claim 5, further comprising the step of varying directions in which said first to N-th mask patterns extend to thereby measure spherical aberration entirely in a pupil.

* * * * *